(12) United States Patent
Köppel et al.

(10) Patent No.: US 11,585,855 B2
(45) Date of Patent: Feb. 21, 2023

(54) MEASURING ASSEMBLY FOR MEASURING TEMPERATURE AND VOLTAGE

(71) Applicant: SAMSUNG SDI CO., LTD., Yongin-si (KR)

(72) Inventors: Andreas Köppel, Haselsdorf-Tobelbad (AT); Fritz Haring, Bruck an der Mur (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 25 days.

(21) Appl. No.: 17/209,295

(22) Filed: Mar. 23, 2021

(65) Prior Publication Data

US 2021/0302504 A1  Sep. 30, 2021

(30) Foreign Application Priority Data

Mar. 25, 2020 (EP) .................................. 20165657
Mar. 22, 2021 (KR) ........................ 10-2021-0036487

(51) Int. Cl.
*G01R 31/36* (2020.01)
*G01R 31/3835* (2019.01)
(Continued)

(52) U.S. Cl.
CPC ......... *G01R 31/3644* (2013.01); *G01K 13/00* (2013.01); *G01R 31/3835* (2019.01); *H01M 10/486* (2013.01); *H01M 50/502* (2021.01); *H01M 50/507* (2021.01); *H01M 2220/20* (2013.01)

(58) Field of Classification Search
None
See application file for complete search history.

(56) References Cited

U.S. PATENT DOCUMENTS

2015/0064524 A1   3/2015   Noh et al.
2015/0140393 A1*  5/2015   Yamamoto ........... H01R 11/288
                                                           429/121

(Continued)

FOREIGN PATENT DOCUMENTS

DE    102012213673 A1    2/2014
EP       2842797 A1      3/2015
(Continued)

OTHER PUBLICATIONS

Extended European Search report dated Sep. 21, 2020 from EP 20165657.6.

*Primary Examiner* — Jas A Sanghera
(74) *Attorney, Agent, or Firm* — Lee IP Law, P.C.

(57) ABSTRACT

A measuring assembly for measuring a temperature and a voltage includes a contact element including a temperature sensor and an electrically conductive portion, a voltage measurement conductor electrically connected to the conductive portion of the contact element, and an electrically conductive fixation element electrically connected to the conductive portion of the contact element, the electrically conductive fixation element extending through a fixation hole of a busbar in a fixed state to connect to the busbar by an elastic force provided by the electrically conductive fixation element in the fixed state, and the electrically conductive fixation element pressing the contact element to a measuring surface of the busbar by the elastic force in the fixed state.

18 Claims, 4 Drawing Sheets

(51) Int. Cl.
  *G01K 13/00*    (2021.01)
  *H01M 50/507*   (2021.01)
  *H01M 50/502*   (2021.01)
  *H01M 10/48*    (2006.01)

(56) References Cited

U.S. PATENT DOCUMENTS

2015/0372354 A1* 12/2015 Nakano .................. B60L 50/64
                                                429/90
2018/0342717 A1   11/2018 Shoji et al.

FOREIGN PATENT DOCUMENTS

FR         3042321 A1    4/2017
JP         2016-18741 A  2/2016

* cited by examiner

MEASURING ASSEMBLY FOR MEASURING TEMPERATURE AND VOLTAGE

CROSS-REFERENCE TO RELATED APPLICATION

European Patent Application No. 20165657.6, filed on Mar. 25, 2020, in the European Intellectual Property Office, and Korean Patent Application No. 10-2021-0036487, filed on Mar. 22, 2021, in the Korean Intellectual Property Office, both entitled: "Measuring assembly for measuring a temperature and a voltage," are both incorporated by reference herein in their entirety.

BACKGROUND

1. Field

The present disclosure relates to a measuring assembly for measuring temperature and voltage. Further, a battery system with such a measuring assembly and an electrical vehicle with such a battery system are disclosed.

2. Description of the Related Art

In recent years, vehicles have been developed using electric power as a source of motion. An electric vehicle is an automobile that is powered by an electric motor using energy stored in rechargeable batteries. An electric vehicle may be solely powered by rechargeable batteries or may be a form of hybrid vehicle powered by, e.g., a gasoline generator. Furthermore, the hybrid vehicle may include a combination of electric motor and conventional combustion engine. In general, an electric-vehicle battery (EVB) or traction battery is a battery used to power the propulsion of battery electric vehicles (BEVs). EVBs differ from starting, lighting, and ignition batteries because they are designed to give power over sustained periods of time.

A rechargeable or secondary battery differs from a primary battery in that it can be repeatedly charged and discharged, while the latter provides only an irreversible conversion of chemical to electrical energy. Low-capacity rechargeable batteries are used as power supply for small electronic devices, e.g., cellular phones, notebook computers and camcorders, while high-capacity rechargeable batteries are used as the power supply for hybrid vehicles and the like.

Rechargeable batteries may be used as a battery module formed of a plurality of unit battery cells coupled in series and/or in parallel so as to provide a high energy density, e.g., for motor driving of a hybrid vehicle. A battery module may be formed by interconnecting the electrode terminals of the plurality of unit battery cells depending on a required amount of power and in order to realize a high-power rechargeable battery. The unit battery cells can be connected in series, parallel or in a mixture of both to deliver the desired voltage, capacity, or power density. Components of battery packs include the individual battery modules and the interconnects, which provide electrical conductivity between them.

For meeting the dynamic power demands of various electrical consumers connected to the battery system a static control of battery power output and charging is not sufficient. Thus, steady exchange of information between the battery system and the controllers of the electrical consumers is required. This information includes the battery systems actual state of charge (SoC), potential electrical performance, charging ability, and internal resistance, as well as actual or predicted power demands or surpluses of the consumers.

Battery systems usually include a battery control unit for processing the aforementioned information. The battery control unit may include controllers of the various electrical consumers and contain suitable internal communication busses, e.g. a SPI or CAN interface. The battery control unit may further communicate with battery submodules, e.g., with cell supervision circuits or cell connection and sensing units. Thus, the battery control unit may be provided for managing the battery pack, e.g., protecting the battery from operating outside its safe operating area, monitoring its state, calculating secondary data, reporting that data, controlling its environment, authenticating it and/or balancing it.

Busbars are electrical conductors which are adapted to carry an electrical current and distribute or transport electrical power. For example, busbars may be used to electrically connect positive and negative electrode terminals of battery cells, e.g., of neighboring battery cells or end terminals of a battery cell stack. The electrical quantities, e.g., voltage and the temperature, of the busbar are therefore of particular relevance and need to be carefully monitored. Therefore, these two quantities are regularly monitored to allow an instant reaction when it is detected that operating conditions of a battery system are not anymore met.

SUMMARY

Embodiments of the present disclosure provide a measuring assembly, including a contact element having a temperature sensor and an electrically conductive portion, a voltage measurement conductor which is electrically connected to the conductive portion of the contact element, an electrically conductive fixation element which is electrically connected to the conductive portion of the contact element, wherein the fixation element is adapted such that it extends through a fixation hole of a busbar and connects to the busbar by an elastic force provided by the fixation element in a fixed state, and wherein the fixation element is adapted such that, in the fixed state, it presses the contact element to a measuring surface of the busbar by an elastic force provided by the fixation element in the fixed state.

The contact element may include a contact side which, in the fixed state, contacts the busbar by forming a planar contact. Thereby, an improved heat transition is provided. A planar contact may be referred to as an areal contact zone between the contact side and the busbar or, more precise, the measuring surface of the busbar.

The fixation element may include a shaft portion which extends through the fixation hole in the fixed state and a bent portion which is connected to the shaft portion and which, in the fixed state, is bent from a shaft direction of the shaft portion towards the measuring surface of the busbar, wherein the contact element is connected to an end of the bent portion. The connection and landing of the contact element to the busbar is improved due the flat transition from bent portion to contact element.

The end of the bent portion may contact the busbar in the fixed state and/or is oriented parallel to the measuring surface. Thereby, the connection of the contact element to the busbar is further improved.

An inner space may be formed between the bent portion and the busbar in the fixed state. Thereby, the induced elastic force acting on the contact element generated by the fixed fixation element may be increased.

The fixation element may include a tip portion connected to the shaft portion having a width being greater than a width of the fixation hole in the fixed state such that the busbar is clamped between the contact element and the tip portion in the fixed state. Thereby, a stable fixation of the contact element and, in consequence, the temperature sensor to the busbar is provided.

The tip portion may include a widening portion which widens with respect to the shaft portion and may include a narrowing portion which narrows towards a tip of the tip portion from the widening portion. By this geometry, the fixation element can be forced through the fixation hole to implement the fixed state by a force that overcomes the elastic deformation force. Also, the fixation can, in reverse, be releasably disengaged by a force that overcomes the elastic deformation force.

The contact element may include an insulator adapted to fix the temperature sensor in the contact element such that the temperature sensor is electrically insulated from the voltage measurement conductor and/or the conductive portion. Thereby, the temperature sensor is protected from electricity in the busbar. Damage or faulty behavior of the temperature sensor may be prevented by the insulation.

The insulator may be an epoxy resin. An epoxy resin is a suitable insulator for the voltages of typical busbar applications in battery systems for electric vehicles and may be suitable for large range of voltages, i.e. 12 V, 48V, 500 V, 1000 V but the disclosure is not restricted to these voltages.

The fixation element may be formed of a metal sheet part. This allows a fast manufacture of the particular form of the fixation element and the required shape to generate the elastic forces required in the fixed state.

The voltage measurement conductor may be connected to the contact element by a weld. Preferably, an ultrasonic weld is provided. Thereby, a stable electric connection for high voltages is advantageously provided.

The conductive portion of the contact element and the fixation element may be integrally formed. Thereby, mechanical strength and conductivity is improved of the measuring assembly due to the avoidance of interface resistances.

A contact direction of the contact side of the contact element may be tilted with respect to the shaft direction in the unfixed state, such that an acute angle α>0° is formed between the shaft direction and the contact direction of the contact side of the contact element in the unfixed state. This may ensure that the planar contact is kept also under the effective elastic force in the fixed state, in particular on the side of the contact element facing away from the fixation element.

In another aspect of the disclosure, a battery pack including a measuring assembly according to one of the embodiments as described above and in the following is provided.

In another aspect of the disclosure, a battery system including a measuring assembly according to one of the embodiments as described above and in the following is provided. Safety for the battery pack and the battery system can be improved because at positions like the main relays the temperature measurement combined with the voltage measurement can be implemented and realized.

Further, an electrical vehicle including a battery system according to an embodiment as described above or as described in the following.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
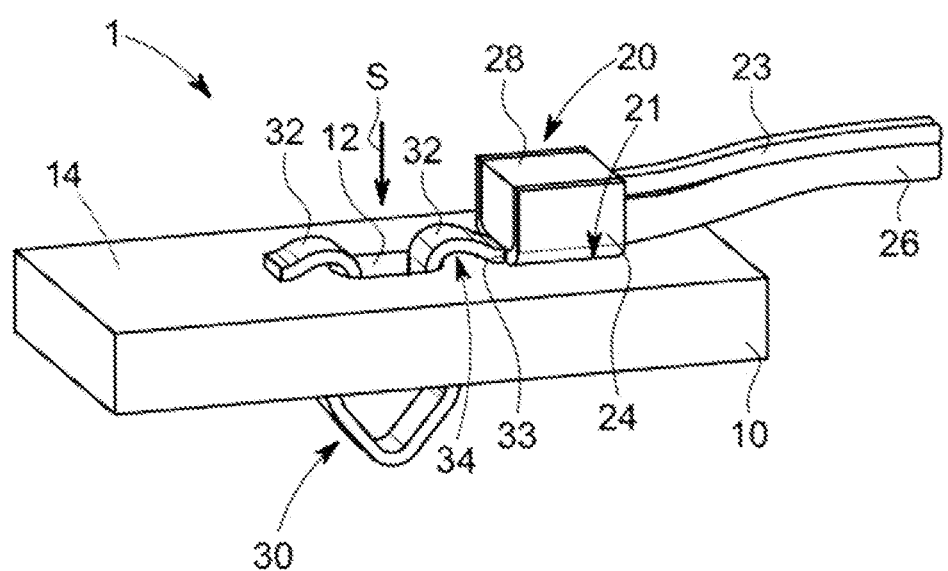
FIG. 1 illustrates a perspective view of a measuring assembly with a busbar according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In the following description of embodiments, the terms of a singular form may include plural forms unless the context clearly indicates otherwise.

It will be further understood that the terms "include," "comprise" "including" or "comprising" specify a property, a region, a fixed number, a step, a process, an element, a component, and a combination thereof but do not exclude other properties, regions, fixed numbers, steps, processes, elements, components, and combinations thereof.

The terminology used herein is for the purpose of describing particular embodiments only and is not intended to be limiting.

As used herein, the term "substantially", "about" and similar terms are used as terms of approximation and not as terms of degree, and are intended to account for the inherent deviations in measured or calculated values that would be recognized by those of ordinary skill in the art. Further, if the term "substantially" is used in combination with a feature that could be expressed using a numeric value, the term "substantially" denotes a range of +/−5% of the value centered on the value. Further, the use of "may" when describing embodiments refers to "one or more embodiments." Herein, the terms "upper" and "lower" are defined according to the z-axis.

In general, busbars refer to electrical conductors which are adapted to carry an electrical current to distribute or transport electrical power. As an example, busbars are used to electrically connect positive and negative electrode terminals of battery cells, e.g., positive terminals of neighboring battery cells or end terminals of a battery stack. Therefore, a "fixed state" of a busbar is referred to an engaged state of the busbar, i.e., a state in which a fixation element engages with the busbar such that induced elastic forces connect or press the fixation element to the busbar. In this case, the elastic force refers to a force that results from tension or energy stored in the fixation element due to elastic deformation when fixed to the busbar. Therefore, the elastic force implies further that the fixation element is suitably elastically deformable and non-rigid. In the fixed state, the elastic force may then lead to the pressing of a contact element towards the busbar. For example, the fixation element may be a fixation clip.

FIG. 1 shows a perspective view of a measuring assembly 1 for measuring temperature and voltage, inserted into a busbar 10 according to an embodiment.

Referring to FIG. 1, the busbar 10 may be an electrical conductor to carry an electric current. For example, the busbar 10 may be used to electrically connect positive and negative electrode terminals of battery cells, e.g., terminals of neighboring battery cells or end terminals of a battery system and/or a battery pack.

The busbar 10 may include a fixation hole 12, e.g., the fixation hole 12 may extend through an entire thickness of the busbar 10. The fixation hole 12 may be manufactured by cutting a hole into the busbar 10 which is a fast and cheap process. In the present example embodiment, the fixation hole 12 may be a slot or an oblong hole, but embodiments are not restricted thereto, e.g., the fixation hole 12 may be round or rectangular in a top view.

The measuring assembly 1 may include a contact element 20, a voltage measurement conductor 26 connected to the contact element 20, and a fixation element 30. The fixation element 30 may attach the measuring assembly 1 to the fixation hole 12 of the busbar 10. The contact element 20, the voltage measurement conductor 26, and the fixation element 30 of the measuring assembly 1 will be described in more detail below with reference to FIGS. 2-5.

Figure 2:
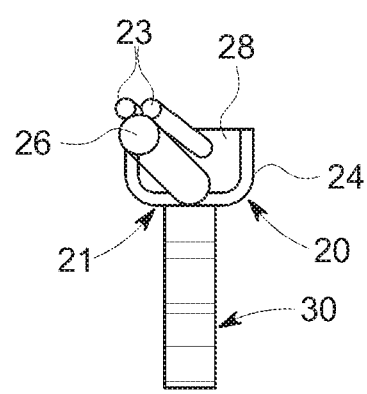
FIG. 2 illustrates a perspective view of a connection of a contact element according to an embodiment.
Figure 3:
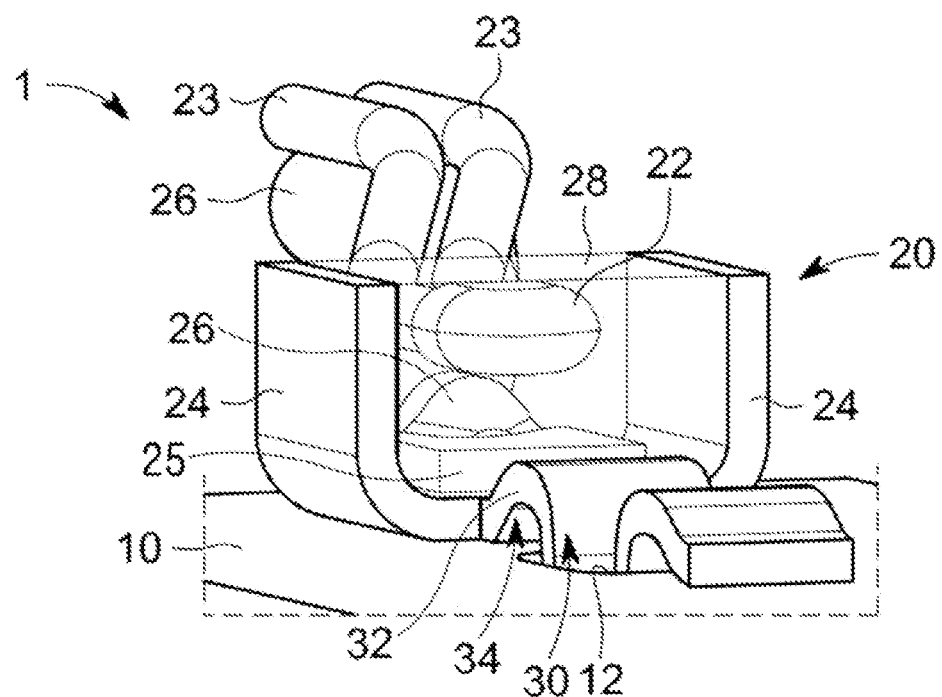
FIG. 3 illustrates a perspective view of a contact element with a temperature sensor according to an embodiment.
Figure 4:
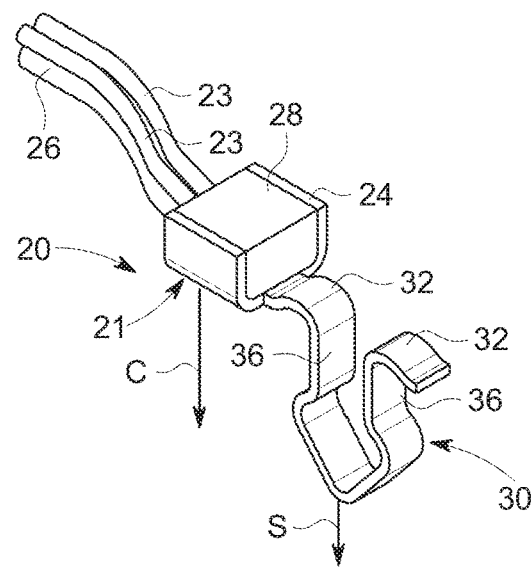
FIG. 4 illustrates a perspective view of a measuring assembly according to an embodiment.
Figure 5:
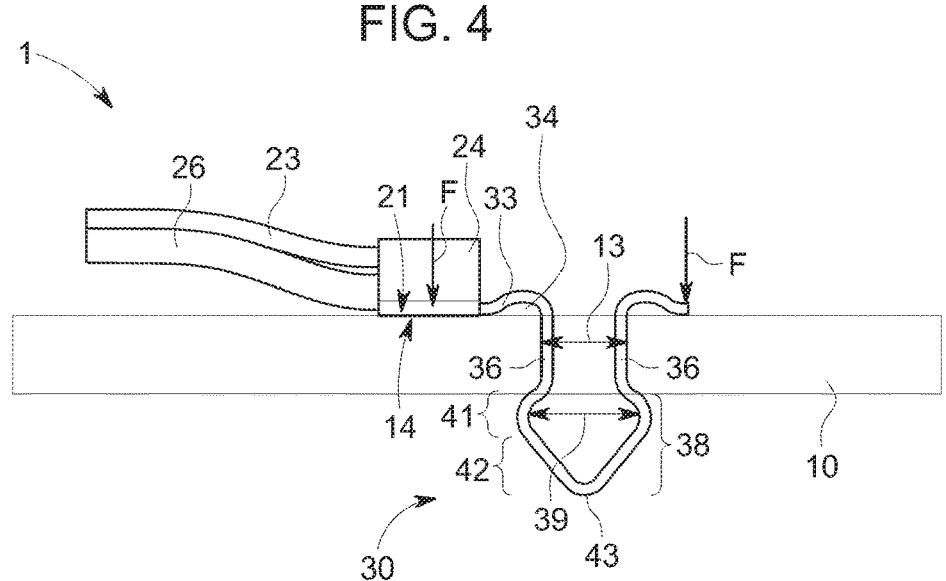
FIG. 5 illustrates a side view of a measuring assembly with a busbar according to an embodiment.

FIG. 2 illustrates the measuring assembly 1 without the busbar 10, as viewed from the side of the voltage measurement conductor 26. FIG. 3 illustrates an enlarged perspective view of a temperature sensor inside the contact element 20 of the measuring assembly 1. FIG. 4 illustrates a perspective view of the measuring assembly 1 without the busbar 10 according to an embodiment. FIG. 5 illustrates a side view of the measuring assembly 1 inserted into the busbar 10 according to an embodiment.

Referring to FIG. 3, the contact element 20 may include a temperature sensor 22 and an electrically conductive portion 24. The electrically conductive portion 24 may be positioned on the busbar 10, and may be connected to the fixation element 30.

In detail, the temperature sensor 22 may measure the temperature at the busbar 10. For example, the temperature sensor 22 may be a semiconductor bandgap temperature sensor or a thermocouple, but embodiments are not restricted thereto and any suitable temperature sensor may be used.

The electrically conductive portion 24 may be formed at least on a bottom side of the contact element 20 facing the busbar 10 in the fixed state. The conductive portion 24 may additionally be formed on at least one of opposite side surfaces connected to the bottom surface. For example, as illustrated in FIG. 2, the conductive portion 24 may have a U-shaped cross section. In another example, the conductive portion 24 may only be formed on the bottom side facing the busbar 10 in the fixed state, e.g., as a flat plate. For example, as illustrated in FIG. 3, the electrically conductive portion 24 may be a, e.g., thermally and electrically, conductive U-shaped frame with open top and sides that accommodates at least the temperature sensor 22 therein. The temperature sensor 22 may be fixed in the contact element 20 by an insulator 28, as will be described in more detail below.

Referring to FIGS. 1-4, the voltage measurement conductor 26 may be electrically connected to the conductive portion 24 of the contact element 20. For example, as illustrated in FIG. 3, a connector 25 may be provided on, e.g., inside, the conductive portion 24, e.g., on a bottom of the contact element 20, and the voltage measurement conductor 26 may be electrically connected to the conductive portion 24 through the connector 25. For example, the connector 25 may have a plate shape, and may be connected to the conductive portion 24 of the contact element 20. In another example, the voltage measurement conductor 26 may be directly connected to, e.g., an external side of, the conductive portion 24.

For example, as illustrated in FIGS. 1 and 2, the voltage measurement conductor 26 may be connected to the contact element 20, e.g., to the conductive portion 24, at a side facing away from the fixation element 30, e.g., the voltage measurement conductor 26 and the fixation element 30 may be connected to opposite sides of the contact element 20. The voltage measurement conductor 26 may be connected to the contact element 20 by welding, e.g., ultrasonic welding, via a weld, e.g., a welded joint, to provide a strong connection. A linearly formed plug may be formed by the geometrical assembly which can be simply and intuitively attached to the fixation hole 12 via the fixation element 30, as will be described in more detail below.

The voltage measurement conductor 26 may be a high voltage wire. Also, temperature measurement conductors 23 may be provided to transmit a low voltage differential signal indicative of a measured temperature of the busbar 10 measured by the temperature sensor 22. The temperature measurement conductors 23 may be connected to the contact element 20 and to the temperature sensor 22 on the same side of the contact element 20 as the voltage measurement conductor 26 (FIG. 3). For example, as illustrated in FIGS. 1-4, the temperature measurement conductors 23 may extend along the voltage measurement conductor 26.

Referring to FIGS. 3-4, the fixation element 30 may be an electrically conductive element electrically connected to the conductive portion 24 of the contact element 20. The fixation element 30 may be suitably elastically deformable, e.g., to be compressible for fixation.

In detail, the fixation element 30 may be formed such that it passes through the fixation hole 12 of the busbar 10 in the fixed state, as shown in FIG. 1. The fixation element 30 may be further adapted to connect to the busbar 10 by an elastic force F provided by the fixation element 30 in the fixed state. The elastic force F may be a response to elastic tension stored in the fixation element 30 provided by the fixation element 30 when engaging with the busbar 10 (FIG. 5).

Further, the fixation element 30 may be adapted such that, in the fixed state, it presses the contact element 20 to the measuring surface 14 of the busbar 10 (FIG. 1). The pressing is generated by the elastic force F provided by the fixation element 30. In other words, by engaging the fixation element 30 with the busbar 10, an elastic tension is generated and deformation energy is stored in the fixation element 30, resulting in the provision of the elastic force F acting on the contact element 20 to press the contact element 20 toward the measuring surface 14 of the busbar 10. The resulting elastic force F is schematically shown in FIG. 5 for illustration purposes, only.

By the induced elastic force F due to the connected fixation element 30, the contact element 20 is in a strong coupling contact with the busbar 10. Therefore, the temperature measurement is improved, since the heat transition from the busbar 10 toward the contact element 20 (and thereby toward the temperature sensor 22) is facilitated. In consequence, the temperature measurement may be systematically improved and exhibit higher accuracy relative to the real temperature at the busbar 10, thereby reducing and/or eliminating systematic measurement errors. Further, tolerances during the manufacturing process may be compensated by the provided elastic force in the fixed state.

As illustrated in FIGS. 1-2, the contact element 20 may include a contact side 21 which, in the fixed state, contacts the busbar 10 under the formation of a planar contact. For example, referring to FIGS. 1-2, the contact side 21 of the contact element 20 may have a flat plate shape, e.g., the contact side 21 may define a bottom of the contact element 20 that contacts the busbar 10, and may have a planar surface contact with the busbar 10 in the fixed state, e.g., the contact side 21 may be a bottom portion of the conductive portion 24 that has a surface contact with the measuring surface 14 of the busbar 10. Due to the planar contact between the contact side 21 and the busbar 10, the heat transition and transport from the busbar 10 to the temperature sensor 22 is further improved to enhance the precision of the temperature measurement of the busbar 10, e.g., the contact side 21 may be connected to the temperature sensor 22 to facilitate temperature measurement. In the unfixed state, e.g. visible in FIG. 4, a contact direction C of the contact side 21 of the contact element 20 may be oriented parallel to the shaft direction S.

Since the fixation element 30 is electrically conductive and contacts the busbar 10, the conductive portion 24 of the contact element 20 is on the same electrical potential, e.g., the fixation element 30 may directly electrically connect between the busbar 10 and the conductive portion 24 to have a same electrical potential. Thus, the voltage measurement conductor 26 (which is electrically connected to the conductive portion 24) is directly sensing the potential/voltage of the busbar 10. Therefore, according to embodiments, a single connection via the contact element 20 may provide measurement of both temperature and voltage in a combined manner. No duplicative connections for the two sensing paths have to be provided.

For example, the conductive portion 24 of the contact element 20 and the fixation element 30 may be integrally formed, e.g., as a single and seamless unit without connectors therebetween, to mechanically strengthen the assembly and reduce interface conductive resistance. Then, a one-pieced sensor plug to measure temperature and voltage in a combined way is provided.

The fixation element 30 will be described in more detail below with reference to FIG. 4. Referring to FIG. 4, the fixation element 30 may be formed of a metal sheet, e.g., thin and flexible metal sheet that can be easily bent. The fixation element 30 may be manufactured by bending a stripe of conductive metal, e.g., a metal sheet. As illustrated in FIG. 4, the fixation element 30 may include a shaft portion 36, a bent portion 32, and a tip portion 38.

In detail, the shaft portion 36 may be a straight part, which is oriented in a shaft direction S. The shaft direction S may be oriented parallel to the extension of the fixation hole 12 through the busbar 10 in the fixed state, e.g., the shaft direction S may be oriented in parallel to a thickness direction of the busbar 10. The shaft portion 36 may extend through the fixation hole 12 in the fixed state. The shaft portion 36 may provide a friction contact with inner walls of the fixation hole 12 in the fixed state.

The bent portion 32 may be connected to the shaft portion 36 and may bend from the shaft direction S of the shaft portion 36 toward the measuring surface 14 of the busbar 10. For example, as illustrated in FIG. 1, the bent portion 32 may extend out of the fixation hole 12 along the measuring surface 14. For example, as illustrated in FIG. 1, the bent portion 32 may be connected to the contact element 20, e.g., to the conductive portion 24 of the contact element 20.

For example, as further illustrated in FIG. 1, the bent portion 32 may include a flat end 33 connected to the conductive portion 24 of the contact element 20, thereby improving electrical contact between the bent portion 32 and the contact element 20. For example, as illustrated in FIGS. 1 and 5, the flat end 33 may be an edge of the bent portion 32 having a flat surface facing the measuring surface 14 and a flat surface facing the contact element 20, thereby improving contact with the measuring surface 14 and the contact element 20, e.g., with the conductive portion 24. In other embodiments, an additional flat portion may be interconnected between the flat end 33 and the contact element 20.

As illustrated in FIG. 1, the flat end 33 of the bent portion 32 may be in contact with the busbar 10 in the fixed state. For example, the flat end 33 may be oriented parallel to the measuring surface 14 of the busbar 10 in the fixed state. Thereby, the connection and landing of the contact element 20 to the measuring surface 14 of the busbar 10 may be improved.

As illustrated in FIGS. 1 and 3, an inner space 34 may be formed between the bent portion 32 and the busbar 10 in the fixed state, e.g., between the bent portion 32 and the measuring surface 14 of the busbar 10. Due to the inner space 34, the bent portion 32 does not directly follow the edge of the fixation hole 12, e.g., the bent portion 32 may provide a vertical force oriented toward the measuring surface 14 of the busbar 10 (rather than a flat portion along a horizontal direction). In other words, the curvature of the bent portion 32 is less than the curvature of the edge at the fixation hole 12. The bent portion 32 may provide an effective normal elastic force F to press the contact element 20 to the busbar 10.

As illustrated in FIG. 5, the fixation element 30 may include the tip portion 38 which is connected to the shaft portion 36, e.g., the tip portion 38 and the bent portion 32 may be at opposite ends of the shaft portion 36 along the shaft direction S. For example, as illustrated in FIG. 4, the tip portion 38, the shaft portion 36, and the bent portion 32 may be all integral with each other, i.e., formed of a single metal sheet bent into the shaft portion 36 with the tip portion 38 ad the bent portion 32. For example, the tip portion 38 may be inserted through the fixation hole 12 of the busbar 10. The tip portion 38 may include a maximum width 39 being greater than a width 13 of the fixation hole 12 and the shaft portion 36. Therefore, the busbar 10 may be clamped between the contact element 20 and the tip portion 38 in the fixed state. Thus, a strong coupling of the contact element 20 to the busbar 10 is provided by the fixation element 30 to improve the heat transition to the temperature sensor 22.

In detail, as illustrated in FIG. 5, the tip portion 38 may include a widening portion 41 which widens with respect to the shaft portion 36 and a narrowing portion 42 which narrows towards a tip 43 of the tip portion 38 from the widening portion 41 in the shaft direction S. The maximum width 39 may be located at the transition from the widening portion 41 and the narrowing portion 42. The geometry of the tip portion 38 may be referred to as an arrow-shaped contour. The advantage of the geometry is that the fixation element 30 can be readily pressed into the fixation hole 12 and, reversely, be pressed out of the fixation hole 12 by overcoming a force to compress the fixation element 30 such that it fits through the fixation hole 12.

As illustrated in FIGS. 1-3, the contact element 20 may include the insulator 28. The insulator 28 may be adapted and positioned in, e.g., inside, the contact element 20 such that the temperature sensor 22 is fixed in the contact element 20. The temperature sensor 22 may be electrically insulated from the voltage measurement conductor 26 and/or, e.g., sides of, the conductive portion 24 via the insulator 28. For example, as illustrated in FIG. 3, the temperature sensor 22 may be spaced from the voltage measurement conductor 26 and/or sides of the conductive portion 24, and the insulator 28 may be located or filled between the voltage measurement conductor 26 and/or the sides of the conductive portion 24 and the temperature sensor 22, e.g., so the temperature sensor 22 may measure temperature through only a bottom of the conductive portion 24. Therefore, temperature measurement is less affected by electric disturbance. For example, the insulator 28 may be an epoxy resin which is most suitable for voltages applicable for busbars 10 for battery modules and/or battery systems. Therefore, the insulation between the temperature sensor 22 and the voltage measurement conductor 26 is ensured.

Figure 6:
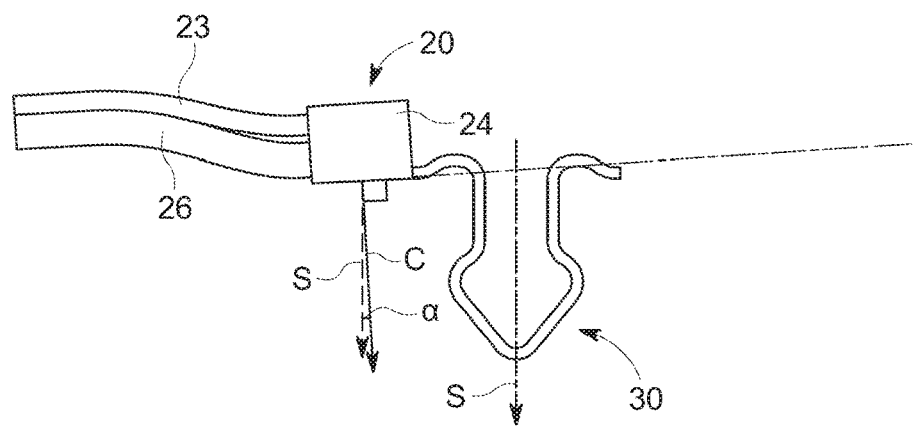
FIG. 6 illustrates a side view of a measuring assembly with a busbar according to another embodiment.

FIG. 6 shows a perspective view of a measuring assembly according to another embodiment. The measuring assembly in FIG. 6 is shown in an unfixed state (without a busbar).

In FIG. 6, a contact direction C of the bottom of the contact element 20 (i.e., a normal from the bottom of the contact element 20), forming a right angle with the bottom of the contact element 20, as indicated by the right angle symbol, may be tilted with respect to the shaft direction S, such that an acute angle α>0° between the shaft direction S and the contact direction C may be formed in the unfixed state. The angle α may be less than 25°, e.g., less than 20° or less than 15°. In the fixed state, when elastic forces act on the contact element 20, the planar contact of the contact element 20 and the busbar 10 without lifting due to the acting normal forces F can be retained due to the tilted angle α.

By way of summation and review, in order to detect the temperature and voltage of a busbar, a temperature sensor and a voltage sensor may be separately provided and connected to the busbar. Therefore, each sensor may require a separate fixation, e.g., bolts and screws, to connect the sensor to the busbar, thereby increasing costs, e.g., due to the number of components used, and potential failures, e.g., due to the number of screws used.

In contrast, according to embodiments, a measuring assembly is provided that is capable of sensing both voltage and temperature, and has an improved connection or contact to the busbar. That is, according to embodiments, a fixation element attaches a contact element with a temperature sensor and a voltage measurement conductor to the busbar. As such, in a fixed state, the contact element is pressed against the busbar (due to an elastic force), and therefore, a stable contact, that is under tension, to the busbar is generated such that an improved heat transition and heat coupling from the busbar to the temperature sensor is provided due to the pressed contact mediated by the elastic force of the fixation element in the fixed state. In consequence, the temperature measurement and accuracy may be systematically improved, thereby reducing and/or eliminating systematic measurement errors. Further, tolerances in the manufacturing process can be compensated by the provided elastic force in the fixed state. Also, measurement of both temperature and voltage may be performed in a combined manner through a single connection (via the contact element), thereby eliminating the need for multiple connections, e.g., no duplicative connections for two sensing are needed. Further, costs can be reduced since no insert bolts are necessary. Also, the risk of failure at the screw case can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A measuring assembly for measuring a temperature and a voltage, the measuring assembly comprising:
   a contact element including a temperature sensor and an electrically conductive portion;
   a voltage measurement conductor electrically connected to the conductive portion of the contact element; and
   an electrically conductive fixation element electrically connected to the conductive portion of the contact element, the electrically conductive fixation element extending through a fixation hole of a busbar in a fixed state to connect to the busbar by an elastic force provided by the electrically conductive fixation element in the fixed state, and the electrically conductive fixation element being bent out of the fixation hole to contact and press the contact element to a measuring surface of the busbar by the elastic force in the fixed state.

2. The measuring assembly as claimed in claim 1, wherein the contact element further includes a contact side which, in the fixed state, contacts the busbar via a planar contact.

3. The measuring assembly as claimed in claim 1, wherein the contact element further includes an insulator between the temperature sensor and the voltage measurement conductor, and between the temperature sensor and sides of the conductive portion.

4. The measuring assembly as claimed in claim 3, wherein the insulator is an epoxy resin.

5. The measuring assembly as claimed in claim 1, wherein the fixation element is a metal sheet.

6. The measuring assembly as claimed in claim 1, wherein the voltage measurement conductor is connected to the contact element by a weld.

7. The measuring assembly as claimed in claim 1, wherein the conductive portion of the contact element and the fixation element are integral with each other.

8. A battery system comprising the measuring assembly as claimed in claim 1.

9. An electrical vehicle including the battery system as claimed in claim 8.

10. The measuring assembly as claimed in the claim 1, wherein the electrically conductive fixation element includes:
    a shaft portion; and
    a bent portion integral with the shaft portion, the bent portion being bent from a top of the shaft portion.

11. The measuring assembly as claimed in the claim 10, wherein the electrically conductive fixation element further includes a tip portion integral with and bent from a bottom of the shaft portion, the tip portion and the bent portion being at opposite ends of the shaft portion.

12. The measuring assembly as claimed in claim 1, wherein the electrically conductive fixation element is a flexible metal sheet, the flexible metal sheet being bent to define an empty space in the fixation hole between facing portions of the flexible metal sheet.

13. A measuring assembly for measuring a temperature and a voltage, the measuring assembly comprising:
    a contact element including a temperature sensor and an electrically conductive portion;
    a voltage measurement conductor electrically connected to the conductive portion of the contact element; and
    an electrically conductive fixation element electrically connected to the conductive portion of the contact element, the electrically conductive fixation element extending through a fixation hole of a busbar in a fixed state to connect to the busbar by an elastic force provided by the electrically conductive fixation element in the fixed state, and the electrically conductive fixation element pressing the contact element to a measuring surface of the busbar by the elastic force in the fixed state,
    wherein the fixation element includes:
    a shaft portion extending through the fixation hole in the fixed state; and
    a bent portion connected to the shaft portion, the bent portion being bent from the shaft portion toward the contact element, and the contact element being connected to an end of the bent portion.

14. The measuring assembly as claimed in claim 13, wherein a bottom of the end of the bent portion is parallel to a bottom of the contact element, the end of the bent portion contacting the busbar in the fixed state and/or is oriented parallel to the measuring surface of the busbar.

15. The measuring assembly as claimed in claim 14, wherein the bent portion curves from the shaft portion toward a bottom of the contact element, an inner space being defined between the bent portion and the busbar in the fixed state.

16. The measuring assembly as claimed in the claim 13, wherein the fixation element further includes a tip portion connected to the shaft portion, the tip portion and the bent portion being at opposite ends of the shaft portion, a width of the tip portion being greater than a width of the shaft portion, and the width of the tip portion being greater than a width of the fixation hole in the fixed state such that the busbar is clamped between the contact element and the tip portion in the fixed state.

17. The measuring assembly as claimed in claim 16, wherein the tip portion includes a widening portion which widens with respect to the shaft portion, and a narrowing portion which narrows toward a tip of the tip portion from the widening portion.

18. The measuring assembly as claimed in claim 13, wherein a contact direction of a bottom of the contact element is tilted with respect to an axis of the shaft portion, such that an acute angle is defined between the axis of the shaft portion and the contact direction.

* * * * *